US012805343B2

(12) United States Patent
Yandoc et al.

(10) Patent No.: US 12,805,343 B2

(45) Date of Patent: Nov. 17, 2026

(54) SEMICONDUCTOR DEVICE PACKAGE AND METHOD FOR MANUFACTURING THE SAME

(71) Applicant: NEXPERIA B.V., Nijmegen (NL)

(72) Inventors: Ricardo Yandoc, Manchester (GB); Matthew Anthony, Manchester (GB); Jorex Lumanog, Cabuyao (PH)

(73) Assignee: Nexperia B.V., Nijmegen (NL)

( * ) Notice: Subject to any disclaimer, the term of this patent is extended or adjusted under 35 U.S.C. 154(b) by 690 days.

(21) Appl. No.: 18/298,709

(22) Filed: Apr. 11, 2023

(65) Prior Publication Data

US 2023/0326836 A1 Oct. 12, 2023

(30) Foreign Application Priority Data

Apr. 11, 2022 (EP) .................................... 22167533

(51) Int. Cl.
*H10W 70/40* (2026.01)
*H10W 74/01* (2026.01)
*H10W 74/10* (2026.01)

(52) U.S. Cl.
CPC ....... *H10W 70/424* (2026.01); *H10W 70/481* (2026.01); *H10W 74/01* (2026.01); *H10W 74/111* (2026.01)

(58) Field of Classification Search
None
See application file for complete search history.

(56) References Cited

U.S. PATENT DOCUMENTS

2010/0052125 A1* 3/2010 Sasaki ............... H01L 23/49541 257/676
2016/0307826 A1 10/2016 McKnight-MacNeil et al.

FOREIGN PATENT DOCUMENTS

EP 2629329 A2 8/2013

* cited by examiner

*Primary Examiner* — Alexander G Ghyka

(74) *Attorney, Agent, or Firm* — Ruggiero McAllister & McMahon LLC

(57) ABSTRACT

Aspects of the present disclosure relate to a semiconductor device package and to a method for manufacturing the same. The semiconductor device package includes a semiconductor die having a circuit integrated thereon, a first clip including a first planar portion and one or more first leads extending from the first planar portion, the first planar portion including one or more first protrusions, and a second clip including a second planar portion and one or more second leads extending from the second planar portion, the second planar portion including a plurality of second protrusions. The first planar portion and the second planar portion each physically and electrically connected to a terminal of the circuit arranged on the semiconductor die. At least one of the one or more first protrusions extends in a space between a pair of second protrusions among the plurality of second protrusions.

17 Claims, 5 Drawing Sheets

SEMICONDUCTOR DEVICE PACKAGE AND METHOD FOR MANUFACTURING THE SAME

CROSS-REFERENCE TO RELATED APPLICATIONS

This application claims the benefit under 35 U.S.C. § 119(a) of European Application No. 22167533.3 filed Apr. 11, 2022, the contents of which are incorporated by reference herein in their entirety.

BACKGROUND

1. Field of the Disclosure

Aspects of the present disclosure relate to a semiconductor device package and to a method for manufacturing the same.

2. Description of the Related Art

Semiconductor device packages typically comprise a semiconductor die on which a circuit is integrated. The semiconductor die is generally encapsulated by a package material to protect said semiconductor die from external damages.

In a clip-based semiconductor device package, connections in the form a clip comprising a planar portion from which one or more leads of the clip extend from within the package material to an outside of the package to be able to contact one or more terminals of the electronic component (s).

Semiconductor device packages are known in the art. Typically, one or more clips as described above are physically and electrically connected to terminals of the circuit integrated on semiconductor die in the package via the planar portion of the clip(s).

The semiconductor die, or the package as a whole, may be exposed to thermal or thermo-mechanical stress, for example during operation. Due to the stress, the package may for example be subjected to deformation. Stress exerted on the die or the package may cause the semiconductor die to break or may cause the circuit integrated on the semiconductor die to fail.

EP2629329A2 discloses a semiconductor device having a structure formed by covering a principal surface of a semiconductor chip having the principal surface and a plurality of MIS type FETs formed over the principal surface with a plurality of metal wires having pectinate shapes. The pectinate parts are allocated alternately in a planar view over the principal surface. The plural metal plate wires are electrically coupled to a plurality of terminals.

US2016/0307826A1 discloses packaging solutions for devices and systems comprising lateral GaN power transistors. In the packaging assembly, a GaN die, comprising one or more lateral GaN power transistors, is sandwiched between first and second lead frame layers, and interconnected using low inductance interconnections, without wire bonding.

SUMMARY

Aspects of the present disclosure relate to a semiconductor device package and a method for manufacturing the same, in which the abovementioned drawback(s) do not occur, or hardly so.

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

According to an aspect of the present disclosure, a semiconductor device package is provided. The semiconductor device package comprises a semiconductor die having a circuit integrated thereon, a first clip comprising a first planar portion and one or more first leads extending from said first planar portion, the first planar portion comprising one or more first protrusions, and a second clip comprising a second planar portion and one or more second leads extending from said second planar portion, the second planar portion comprising a plurality of second protrusions. The first planar portion and the second planar portion are each physically and electrically connected to a same terminal of the circuit arranged on the semiconductor die. Furthermore, at least one of the one or more first protrusions extends in a space between a pair of second protrusions among the plurality of second protrusions.

By arranging the first and second clip with the first and second planar portions in accordance with the present disclosure as described above, a stress on the semiconductor die can be redistributed across the surface of the semiconductor die. In particular, the one or more first protrusions may be interdigitated with the plurality of second protrusions. The Applicant has found that the arrangement described above limits the effects of stress, such as thermomechanical stress, on the semiconductor die during device operation and during thermal cycling reliability tests.

The first planar portion and the second planar portion are electrically connected to a same terminal of the circuit. In this manner, more leads can be provided for a same terminal, thereby decreasing the effective resistance of the external contact for the terminal whilst reducing the stress exerted on the semiconductor die using the first and second clip. As opposed to a continuous single clip for said terminal covering most or all of the semiconductor die, a manufacturability and reliability of the package can be improved. This may for example be due to less stress exerted on the clip during forming of the leads by means of a punching action.

In particular, without arranging at least one of the one or more first protrusions to extend in a space between a pair of second protrusions among the plurality of second protrusions, there would be a gap between the first and second clips leaving a straight and constant exposed area of the semiconductor die, which may constitute a critical stress-sensitive area. By interdigitating the first and second clips, the stress on the semiconductor die can be redistributed accordingly.

For example, a change in temperature may cause the package to bend due to a mismatch in coefficient of thermal expansion between the first and second clip and the semiconductor die. The above-described arrangement can redistribute stress across the semiconductor die and can reduce a risk of the semiconductor die breaking due to this stress.

The one or more first protrusions may be arranged symmetrically along an axis parallel to a direction in which said one or more first protrusions extend. In particular, the one or more first protrusions may have a particular width along a direction perpendicular to the direction in which they extend, and the center lines of the one or more first protrusions may be arranged symmetrically in the direction in which they extend. In a further embodiment, the first planar portion is symmetrical along said axis parallel to the direction in which the one or more first protrusions extend.

Additionally or alternatively, the plurality of second protrusions may be arranged symmetrically along an axis parallel to a direction in which said plurality of second protrusions extend. Similarly to the above, the plurality of second protrusions may have a particular width along a direction perpendicular to the direction in which they extend, and the center lines of the plurality of second protrusions may be arranged symmetrically in the direction in which they extend. In a further embodiment, the second planar portion is symmetrical along said axis parallel to the direction in which the plurality of second protrusions extend.

The one or more first leads may extend along an axis parallel to a direction in which the one or more first protrusions extend. Additionally or alternatively, the one or more second leads may extend along an axis parallel to a direction in which the plurality of second protrusions extend. The one or more first protrusions may extend in a direction opposite to a direction in which the plurality of second protrusions extend.

The first planar portion and the second planar portion may each cover at least 20% of a surface of the semiconductor die on which they are arranged. In a further embodiment, the first planar portion and the second planar portion may each cover at least 30% of said surface of the semiconductor die.

The first planar portion and the second planar portion may be spaced apart on the semiconductor die, and an uncovered portion of a surface of the semiconductor die not covered by the first and second planar portion may form a meandering line. In a further embodiment, the uncovered portion may extend from a first edge of the surface of the semiconductor die to a second edge of said surface, the second edge being opposite the first edge.

The semiconductor device package may further comprise a die pad on which the semiconductor die is arranged. In a further embodiment, the die pad may be electrically conductive, and the circuit may comprise a further terminal electrically connected to the die pad. A surface of the die pad may be exposed to an outside of the semiconductor device package, so as to be able to access the further terminal via said exposed surface of the die pad.

The circuit may comprise a field-effect transistor (FET). However, the present disclosure is not limited to FETs. The circuit could for example instead comprise a bipolar junction transistor (BJT) or other types of transistors. Furthermore, the circuit is not limited to three-terminal devices. For example, the circuit may comprise a two-terminal device, such as a diode, or a four-terminal device, such as a silicon-controlled rectifier, or the circuit may have more than four terminals.

In an embodiment in which the circuit comprises the FET, the first planar portion may be electrically connected to a source terminal of the FET, and the second planar portion may be electrically connected to a drain terminal of the FET. Alternatively, the die pad may be electrically connected to a drain terminal of the FET, and the first clip and the second clip may be electrically connected to a source terminal of the FET. In a further embodiment, the semiconductor device package may further comprise a contact comprising a contact portion and one or more third leads extending from said contact portion. The contact portion may be physically and electrically connected to a gate terminal of the FET.

The semiconductor device package may further comprise a body of solidified molding compound encapsulating the semiconductor die, the first planar portion, the second planar portion and, if applicable, the contact portion. The one or more first leads, the one or more second leads and, if applicable, the one or more third leads may be at least partially arranged externally to the body of solidified molding compound, so as to be able to access the terminals of the circuit on the semiconductor die from an outside of the semiconductor device package through corresponding leads.

The one or more first leads, the one or more second leads and/or, if applicable, the one or more third leads may be gull-wing shaped.

According to another aspect of the present disclosure, a method for manufacturing a semiconductor device package is provided. The method comprises the step of a) providing a semiconductor die having a circuit integrated thereon, a first clip comprising a first planar portion and one or more first leads extending from said first planar portion, the first planar portion comprising one or more first protrusions, and a second clip comprising a second planar portion and one or more second leads extending from said second planar portion, the second planar portion comprising a plurality of second protrusions. The method further comprises the step of b) arranging the first planar portion and the second planar portion on the semiconductor die such that the first planar portion and the second planar portion are each physically and electrically connected to a terminal of the circuit arranged on the semiconductor die and such that at least one of the one or more first protrusions extends in a space between a pair of second protrusions among the plurality of second protrusions.

The first clip may be comprised in a first clip frame comprising a first clip frame portion and one or more of said first clips for manufacturing one or more respective semiconductor device packages. The method may then further comprise separating the first clip from the first clip frame portion, preferably after arranging the first planar portion on the semiconductor die. Additionally or alternatively, the second clip is comprised in a second clip frame comprising a second clip frame portion and one or more of said second clips for manufacturing one or more respective semiconductor device packages. The method may then further comprise separating the second clip from the second clip frame portion, preferably after arranging the second planar portion on the semiconductor die.

Alternatively to the above, the first clip and the second clip may be comprised in a same clip frame comprising a clip frame portion and one or more of said first and second clips for manufacturing one or more respective semiconductor device packages. The first and second planar portion may be arranged substantially simultaneously on the semiconductor die. The method may further comprise separating the first clip and the second clip from the clip frame portion, preferably after arranging the first planar portion and the second planar portion on the top surface of the semiconductor die.

The semiconductor die may be arranged on a die pad prior to performing the method. Alternatively, the method may further comprise providing a die pad and arranging the semiconductor die on said die pad.

The die pad may be electrically conductive, and the circuit comprises a further terminal electrically connected to the die pad, and wherein a surface of the die pad is exposed to an outside of the semiconductor device package.

The die pad may be comprised in a pad frame comprising a pad frame portion and one or more of said die pads for manufacturing one or more respective semiconductor device packages. In that case, the method may further comprise separating the die pad from the pad frame portion.

The one or more first protrusions may be arranged symmetrically along an axis parallel to a direction in which said one or more first protrusions extend. In particular, the one or more first protrusions may have a particular width along a direction perpendicular to the direction in which they extend, and the center lines of the one or more first protrusions may be arranged symmetrically in the direction in which they extend. In a further embodiment, the first planar portion is symmetrical along said axis parallel to the direction in which the one or more first protrusions extend.

Additionally or alternatively, the plurality of second protrusions may be arranged symmetrically along an axis parallel to a direction in which said plurality of second protrusions extend. Similarly to the above, the plurality of second protrusions may have a particular width along a direction perpendicular to the direction in which they extend, and the center lines of the plurality of second protrusions may be arranged symmetrically in the direction in which they extend. In a further embodiment, the second planar portion is symmetrical along said axis parallel to the direction in which the plurality of second protrusions extend.

The one or more first leads may extend along an axis parallel to a direction in which the one or more first protrusions extend. Additionally or alternatively, the one or more second leads may extend along an axis parallel to a direction in which the plurality of second protrusions extend. The one or more first protrusions may extend in a direction opposite to a direction in which the plurality of second protrusions extend.

The first planar portion and the second planar portion may each cover at least 20% of a surface of the semiconductor die on which they are arranged. In a further embodiment, the first planar portion and the second planar portion may each cover at least 30% of said surface of the semiconductor die.

The first planar portion and the second planar portion may be spaced apart on the semiconductor die, and an uncovered portion of a surface of the semiconductor die not covered by the first and second planar portion may form a meandering line. In a further embodiment, the uncovered portion may extend from a first edge of the surface of the semiconductor die to a second edge of said surface, the second edge being opposite the first edge.

The first planar portion and the second planar portion may be electrically connected to a same terminal of the circuit.

The circuit may comprise a field-effect transistor, FET. The first planar portion may be electrically connected to a source terminal of the FET, and the second planar portion may be electrically connected to a drain terminal of the FET. Alternatively, the die pad may be electrically connected to a drain terminal of the FET, and the first planar portion and the second planar portion may be electrically connected to a source terminal of the FET.

The method may further comprise providing a contact comprising a contact portion and one or more third leads extending from said contact portion, and arranging the contact portion on the semiconductor die such that the contact portion is physically and electrically connected to a gate terminal of the FET.

The method may further comprise applying a molding compound and allowing said molding compound to solidify to thereby form a body of solidified molding compound, said body of solidified molding compound encapsulating the semiconductor die, the first planar portion, the second planar portion and, if applicable, the contact portion. The one or more first lead(s), the one or more second leads and, if applicable, the one or more third leads may be at least partially arranged externally to the body of solidified molding compound, so as to be able to access the terminals of the circuit on the semiconductor die from an outside of the semiconductor device package through corresponding leads.

The one or more first leads, the one or more second leads and/or, if applicable, the third leads may be gull-wing shaped already prior to performing the method. The method may further comprise forming the one or more first leads, the one or more second leads and/or, if applicable, the one or more third leads into a gull-wing shape.

BRIEF DESCRIPTION OF DRAWINGS

Next, the present disclosure will be described in more detail with reference to the appended drawings, wherein.

Figure 1A:
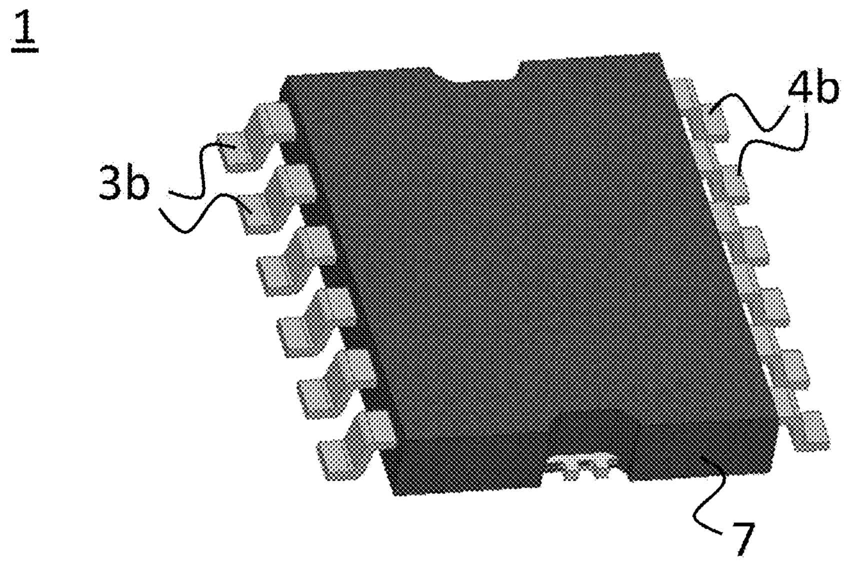
FIGS. 1A and 1B are perspective views of a semiconductor device package according to an embodiment of the present disclosure.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the detailed description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the detailed description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms.

Figure 1B:
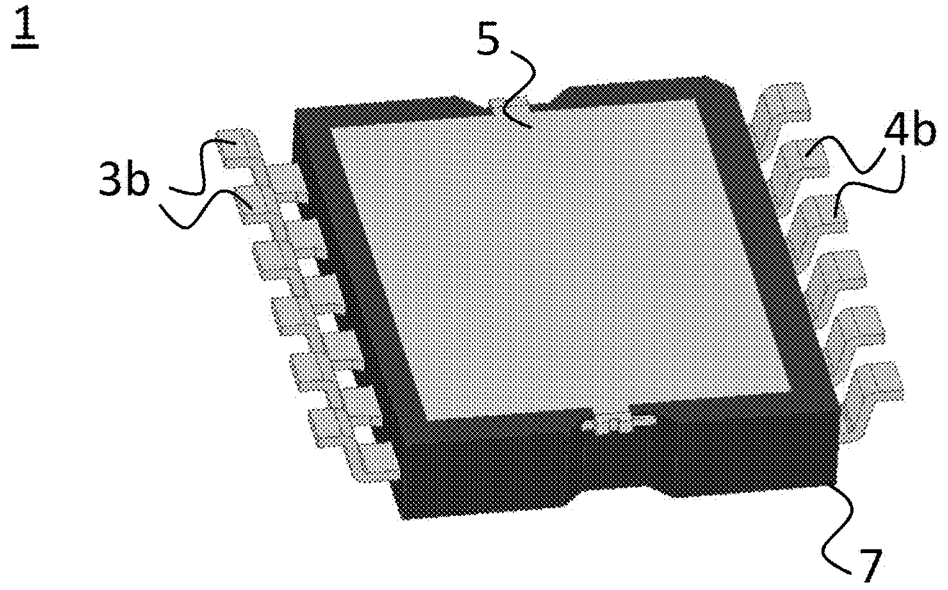
Figure 2:
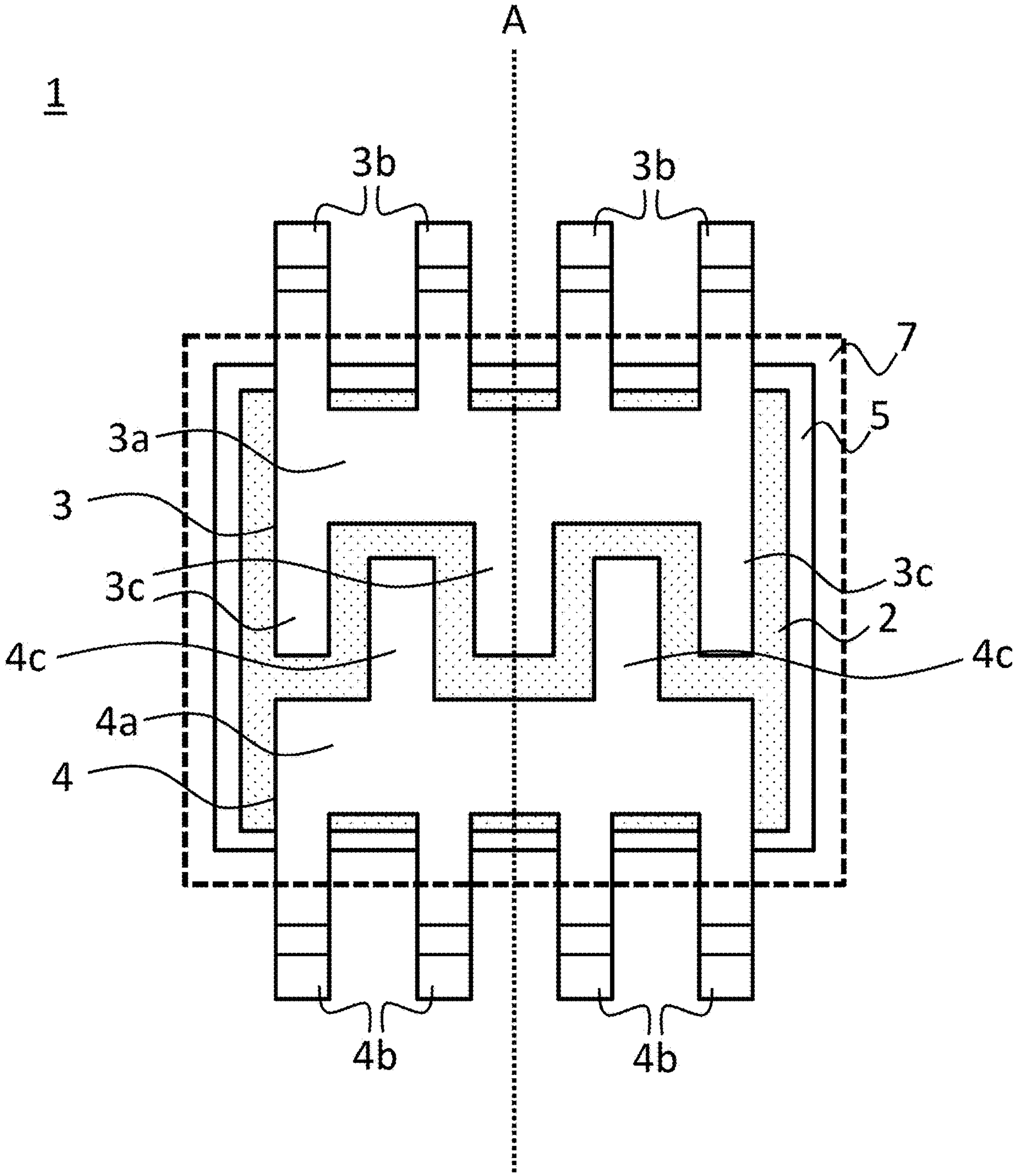
FIG. 2 is a simplified top view of a semiconductor device package according to an embodiment of the present disclosure.

In FIGS. 1A and 1B, a semiconductor device package 1 is shown according to an embodiment of the present disclosure. FIG. 2 shows a corresponding simplified top view of semiconductor device package 1 shown in FIGS. 1A and 1B.

Semiconductor device package 1 comprises first leads 3*b* corresponding to a first clip 3 and second leads 4*b* corresponding to a second clip 4. First leads 3*b* and second leads 4*b* extend out of a body of package material 7 (e.g., a body of solidified molding compound) which encapsulates a semiconductor die 2 having a circuit integrated thereon. First leads 3*b* extend from a first planar portion 3*a* of first clip 3 and second leads 4*b* extend from a second planar portion 4*a* of second clip 4. A shape of first leads 3*b* and second leads 4*b* as shown in FIGS. 1A and 1B may be referred to as a gull-wing shape.

First leads 3*b* and second leads 4*b* provide external access to one or more terminals of a circuit integrated on semiconductor die 2. In particular, first planar portion 3*a* and second planar portion 4*a* are each physically and electrically connected to a terminal of the circuit on semiconductor die 2, and first leads 3*b* and second leads 4*b* are electrically connected to said terminal via first planar portion 3*a* and second planar portion 4*a*, respectively. For example, first leads 3*b* may provide external access to a first terminal among a plurality of terminals of the circuit, and second leads 4*b* may provide external access to a second terminal among said plurality of terminals of the circuit. However, first leads 3*b* and second leads 4*b* may also correspond to and be electrically connected to a same terminal of the circuit.

Here, it is noted that a physical and electrical connection to a terminal of the circuit on semiconductor die 2 may for example refer to a physical and electrical connection to a metallization layer on top of semiconductor die 2, such as aluminum or copper, optionally via a conductive adhesive such as solder material or a sinter layer. First clip 3 and second clip 3 may for example comprise a conductive material, such as a metal (e.g., copper).

As shown in FIG. 2, semiconductor die 2 may be arranged on a die pad 5. Die pad 5 may be electrically and/or thermally conductive and may have a surface that is exposed to an outside of semiconductor device package 1, as shown in FIG. 1B. Die pad 5 may act as a heat sink for semiconductor die 2. Die pad 5 could also act as a package contact of semiconductor device package 1. For example, die pad 5 may be electrically connected to a terminal of the circuit integrated on semiconductor die 2, and the exposed surface may be accessible externally to semiconductor device package 1. However, die pad 5 need not be exposed to an outside of semiconductor device package 1. In some embodiments, die pad 5 may have one or more further leads extending therefrom and out of package material 7, or may be electrically connected to such further leads, whereas die pad 5 is encapsulated by package material 7.

In an example, semiconductor device package 1 may be mounted on an external surface, such as a printed circuit board (PCB), with the exposed surface of die pad 5 facing the external surface. The external surface may comprise a circuit or conductive tracks that electrically connected die pad 5 to an external circuit. Similarly, a bottom surface of first leads 3*b* and second leads 4*b* can form package contacts by which semiconductor device package 1 can be mounted on an external surface. In an embodiment, first leads 3*b* and/or second leads 4*b* are aligned with the exposed surface of die pad 5 such that each of first leads 3*b*, second leads 4*b* and die pad 5 can contact the external surface.

As shown in FIG. 2, first planar portion 3*a* comprises first protrusions 3*c* and second planar portion 4*a* comprises second protrusions 4*c*. First protrusions 3*c* and second protrusions 4*c* are interdigitated, that is, at least one first protrusion 3*c* is arranged in a space between a pair of second protrusions 4*c*. In this manner, thermal and thermomechanical stress exerted on the package, for example during operation, can be redistributed effectively across the semiconductor die.

Furthermore, compared to using a first and second clip that are not interdigitated, a weak area of the die in the space between such a first and second clip is reinforced. In particular, the space between first clip 3 and second clip 4 in FIG. 2 forms a meandering line which prevents semiconductor die 2 from breaking due to, for example, a bending force exerted by thermal or thermomechanical stress or by other external factors on semiconductor device package 1.

First protrusions 3*c* and second protrusions 4*c* need not have the same dimensions, and may instead have varying lengths, in a direction in which said protrusions extend, widths, in a direction perpendicular to the direction in which said protrusions extend.

In FIG. 2, first protrusions 3*c* and second protrusions 4*c* are symmetrically arranged with respect to an axis A. However, the present disclosure is not limited thereto. First clip 3 and second clip 4 may also be asymmetrical. Furthermore, although each of first clip 3 and second clip 4 comprise four leads in FIGS. 1A, 1B and 2, embodiments are envisaged in which first clip 3 and second clip 4 comprise less than four or more than four leads, and/or in which first clip 3 and second clip 4 have a different number of leads, respectively.

As an example only, the circuit integrated on semiconductor die 2 may be a two-terminal device, such as a diode. In that case, first planar portion 3*a* and second planar portion 3*b* may be electrically connected to respective terminals of the two-terminal device. Alternatively, first planar portion 3*a* and second planar portion 3$b$ are each connected to a first terminal of the two-terminal device, and die pad 5, or a further contact as will be appreciated by a person skilled in the art, is electrically connected to a second terminal of the two-terminal device.

In another example, the circuit integrated on semiconductor die 2 may be a three-terminal device, and each of first clip 3, second clip 4 and die pad 5 may be electrically connected to a respective terminal of said three-terminal device.

Figure 3:
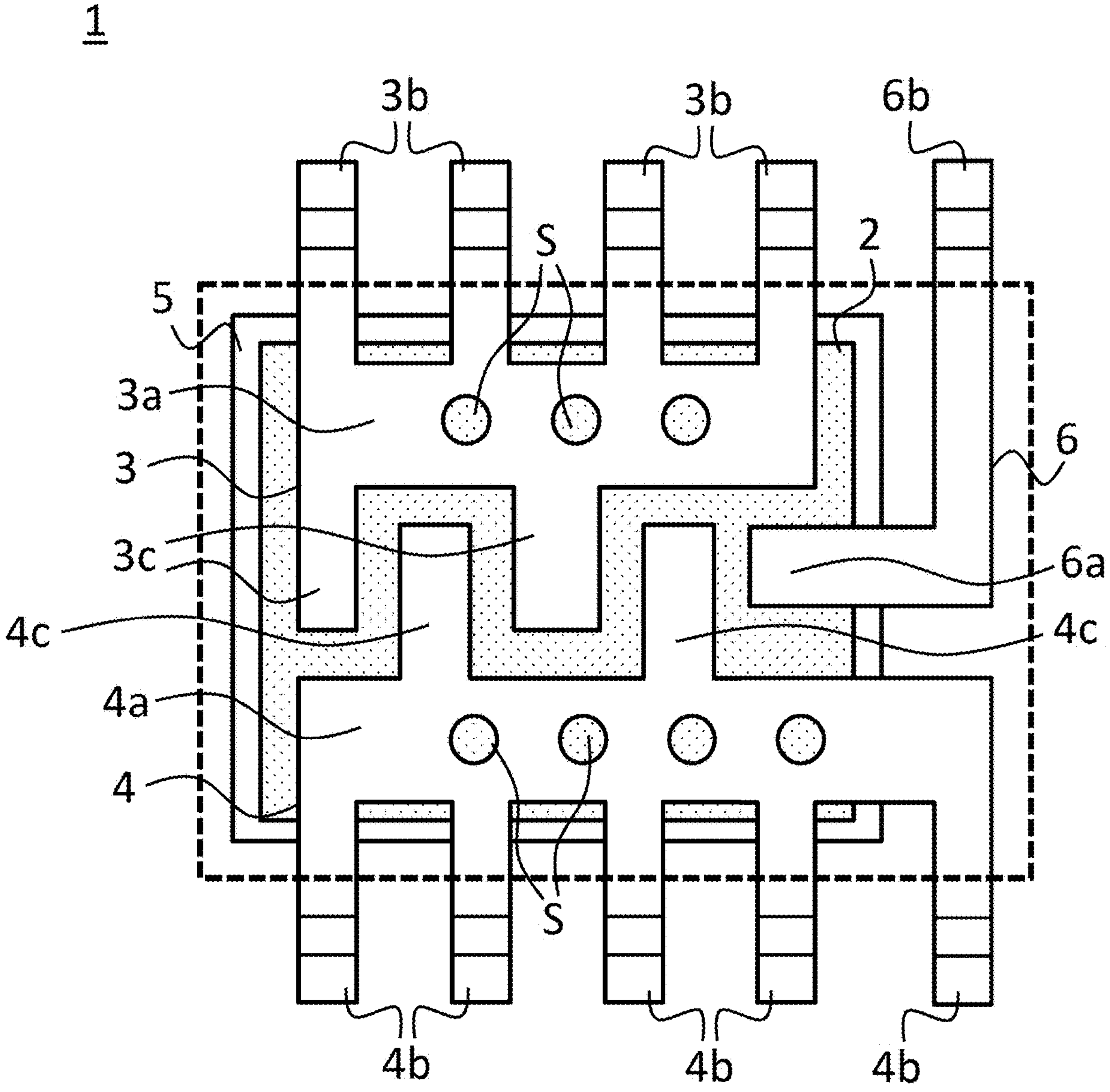
FIG. 3 is a simplified top view of a semiconductor device package according to an embodiment of the present disclosure.

In FIG. 3, a simplified top view of semiconductor device package 1 according to another embodiment of the present disclosure is shown. Semiconductor device package 1 in FIG. 3 mainly differs from that shown in FIG. 2 in that it further comprises a contact 6 having a contact portion 6$a$ physically and electrically connected to a terminal of the circuit integrated on semiconductor die 2, and a third lead 6$b$ extending from said contact portion 6$a$. Furthermore, as shown in FIG. 3, first clip 3 and second clip 4 need not be symmetrical and also need not have a same number of first leads 3$b$ and second leads 3$b$, respectively.

In a preferred embodiment, each of first planar portion 3$a$ and second planar portion 3$b$ cover at least 20% of the top surface of semiconductor die 2, more preferably at least 30%.

In an example, the circuit integrated on semiconductor die 2 is a transistor, such as a FET, a drain terminal thereof being arranged at a bottom surface of semiconductor die 2 and being electrically connected to die pad 5. In this example, die pad 5 forms a package contact of semiconductor device package 1. Furthermore, first planar portion 3$a$ and second planar portion 4$a$ may each be physically and electrically connected to a source terminal of the FET, whereas contact portion 6$a$ is physically and electrically connected to a gate terminal of the FET. The FET may be a metal-oxide-semiconductor FET (MOSFET).

Another factor of stress on semiconductor die 2 is a mismatch in coefficient of thermal expansion between first and second clip 3, 4 and semiconductor die 2. For example, due to a temperature change, first planar portion 3$a$ and/or second planar portion 4$a$ may expand or contract to a different extent compared to semiconductor die 2. To mitigate or limit this effect, sections S of first and/or second planar portions 3$a$, 4$a$ may be omitted, as shown in FIG. 3. Although sections S are shown as having a round shape, the present disclosure is not limited to any particular shape.

Although FIGS. 2 and 3 and the corresponding description above may relate to a circuit comprising a vertical device being integrated on semiconductor die 2, the present disclosure is not limited thereto. Semiconductor die 2 may have integrated thereon a device arranged in a planar or lateral manner, such that the terminals of said device are arranged at a same surface of semiconductor die 2. In such embodiments, die pad 5 need not be electrically conductive and may not be electrically connected to semiconductor die 2 or to a terminal of a circuit integrated thereon.

For example, in FIG. 2, a diode may be integrated on semiconductor die 2, a first terminal thereof being electrically connected to first planar portion 3$a$, and a second terminal thereof being electrically connected to second planar portion 4$a$. Such a diode may be referred to as a lateral diode. Similarly, in FIG. 3, a transistor may be integrated on semiconductor die 2, a first terminal thereof (e.g., a source terminal) being electrically connected to first planar portion 3$a$, a second terminal thereof (e.g., a drain terminal) being electrically connected to second planar portion 4$a$, and a third terminal thereof (e.g., a gate terminal) being electrically connected to contact portion 6$a$. As an example, such a transistor may be an enhanced mode (e-mode) transistor, for example an e-mode Gallium Nitride FET. Furthermore, the transistor may for example also be a BJT instead of a FET. The present disclosure also envisages circuits with more than three terminals integrated on semiconductor die 2, which may be planarly arranged or at least partially vertically arranged.

Next, a process for manufacturing semiconductor device package 1 according to an embodiment of the present disclosure is described with reference to FIGS. 4A-4G.

Figure 4A:
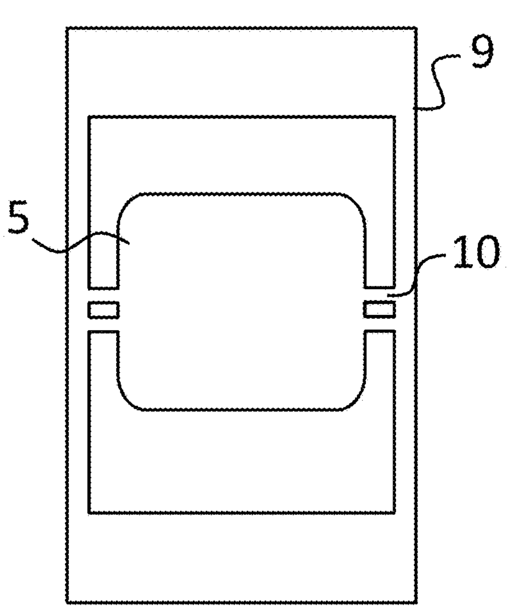
FIGS. 4A, 4B, 4C, 4D, 4E, 4F and 4G illustrate a process for manufacturing a semiconductor device package according to an embodiment of the present disclosure.

In FIG. 4A, a pad frame (e.g., a lead frame) is provided comprising a pad frame portion 9 and die pad 5. Die pad 5 may be fixedly attached to pad frame portion 9 via tie bars 10. The pad frame may comprise a plurality of said die pads (not shown) attached to pad frame portion 9 for manufacturing a plurality of packages substantially simultaneously. For example, a plurality of die pads 5 comprised may be arranged in a pad frame formed as a row or as an array. In the ensuing description below, each step may be performed for multiple of said die pads 5, for example simultaneously or subsequently, or may be performed individually.

Figure 4B:
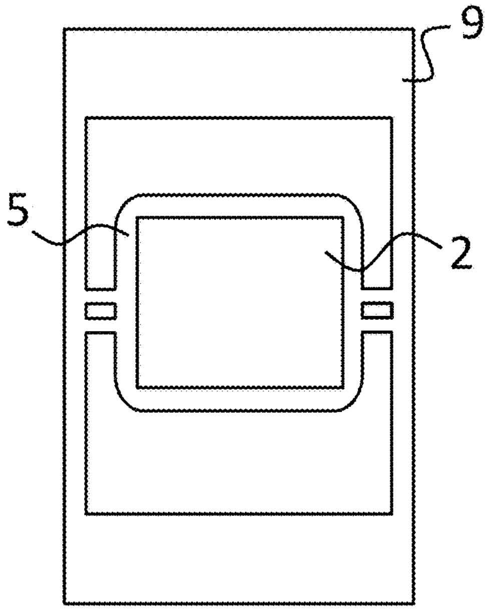

Next, in FIG. 4B, semiconductor die 2 is arranged on die pad 5. In some embodiments semiconductor die 2 is fixedly attached to die pad 5, for example using a conductive adhesive material. As an example only, the conductive adhesive material may comprise a solder layer, such as tin, or a sinter layer, such as sintered silver or sintered copper. As described above, if die pad 5 is electrically conductive, then die pad 5 may additionally be electrically connected to a terminal of the circuit integrated on semiconductor die 2 via said conductive adhesive material.

Figure 4C:
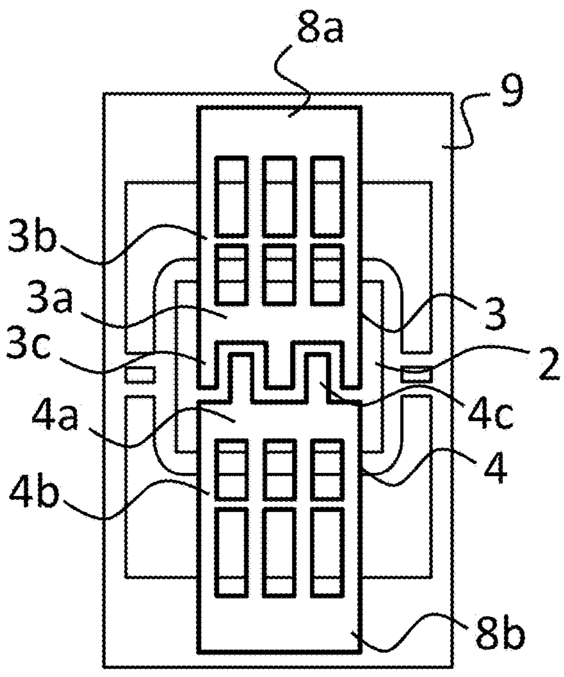

In FIG. 4C, first clip 3 and second clip 4 are provided, and first planar portion 3$a$ and second planar portion 3$b$ are each physically and electrically connected to a terminal of the circuit integrated on semiconductor die 2. First planar portion 3$a$ and second planar portion 4$a$ may be fixedly connected to semiconductor die 2, more in particular to a terminal or respective terminals of the circuit integrated thereon, using a conductive adhesive material, such as a solder layer or a sinter layer. Furthermore, when manufacturing a plurality of packages simultaneously, first clip 3 and second clip 4 may be individually attached for each package in the row or array, or they may be provided in a matrix comprising a plurality of first clips and second clips. At a later stage, the first and second clips corresponding to different packages may be separated from one another.

In this example, first clip 3 is comprised in a first clip frame that further comprises a first clip frame portion 8$a$. Similarly to the pad frame, the first clip frame may comprise a plurality of first clips (not shown) for manufacturing a plurality of packages. In that case, each first clip among the plurality of first clips is attached to first clip frame portion 8$a$. First clip frame portion 8$a$ may be supported by or fixedly connected to pad frame portion 9. In this example, first clip 3 is fixedly attached to first clip frame portion 8$a$ via first leads 3$b$. Similarly to first clip 3, in this example, second clip 4 is comprised in a second clip frame portion 8$b$ that may serve a similar purpose to first clip frame portion 8$a$. Thus, a detailed description thereof is omitted.

Further to the above, first leads 3$b$ and second leads 4$b$ may be interconnected by dam-bars 11$a$, 11$b$, respectively, which may be present for structural rigidity during manufacturing, and may be removed at a later stage.

Here, it is noted that first clip 3 and second clip 4 may be comprised in a same clip frame. For example, first clip frame portion 8$a$ and second clip frame portion 8$b$ may be comprised in a same clip frame and may be mutually fixated, attached or integrally connected to one another. In the manufacturing process, this enables first clip 3 and second clip 4 for one or more packages to be substantially simultaneously positioned and attached to semiconductor die 2.

Although not shown in FIG. 4C, further contacts, such as contact 6 shown in FIG. 3, may be provided, and may be physically and electrically connected to a terminal of the circuit at this stage. It is noted that contact 6 may also be comprised in a same clip frame as first clip 3 and/or second clip 4.

Figure 4D:
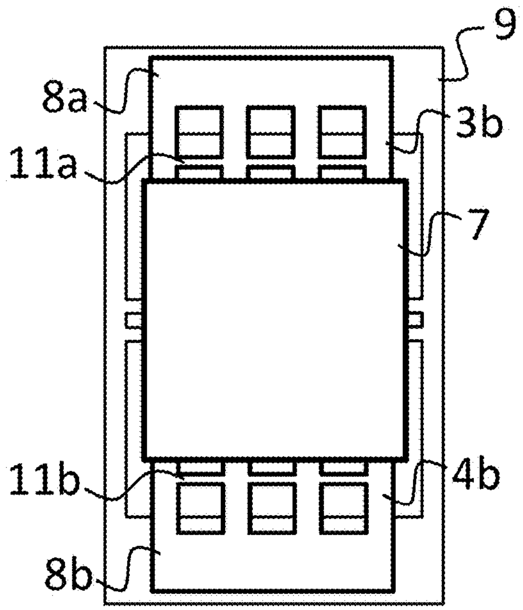

In FIG. 4D, package material 7 is arranged to encapsulate semiconductor die 2, first planar portion 3*a*, second planar portion 4*a*, first protrusions 3*c* and second protrusions 4*c*. As shown in FIG. 4D, a portion of first clip 3 and second clip 4, in particular a portion of first leads 3*b* and second leads 4*b*, is arranged externally to package material 7. Arranging package material 7 may comprise applying a molding compound and allowing said molding compound to solidify to thereby form a body of solidified molding compound.

Figure 4E:
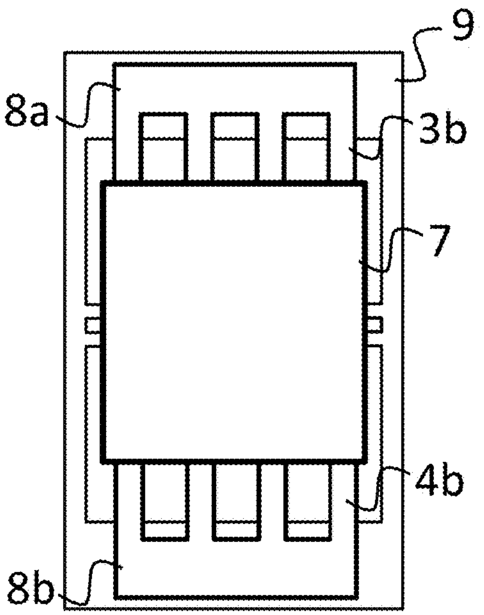

In FIG. 4E, dam-bars 11*a*, 11*b* are removed. For example, removing dam-bars 11*a*, 11*b* may comprise one or more actions from a group consisting of punching, drilling, cutting or sawing, or the like.

Figure 4F:
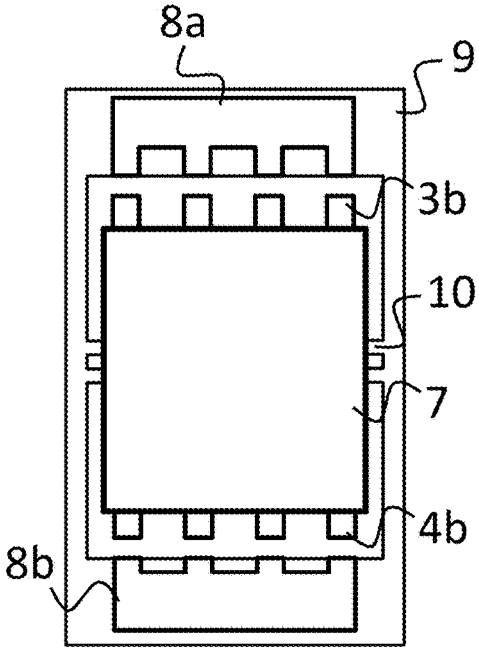

In FIG. 4F, first clip 3 is separated from first clip frame portion 8*a* and second clip 4 is separated from second clip frame portion 8*b*. For example, the separating action may comprise one or more actions from a group consisting of punching, drilling, cutting or sawing, or the like. After separation of first clip 3 and second clip 4 from first clip frame portion 8*a* and second clip frame portion 8*b*, respectively, ends of first clip 3 and second clip 4 respectively form first leads 3*b* and second leads 4*b*.

Figure 4G:
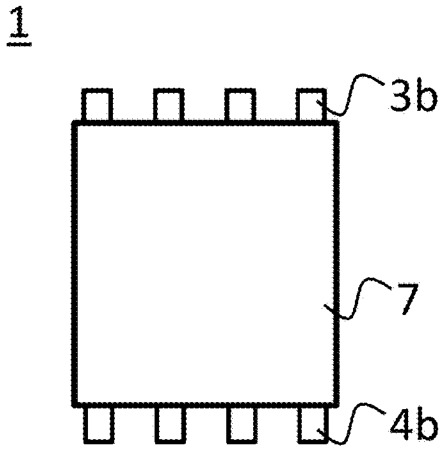

In FIG. 4G, semiconductor device package 1 is obtained by singulating the package from die frame portion 9. For example, the step of singulating may comprise punching, drilling, cutting or sawing tie bars 10 to separate die pad 5, and thus semiconductor device package 1, from die frame portion 9. Similarly to the above, this step may be performed for a plurality of semiconductor device packages (not shown) in a substantially simultaneous manner.

First leads 3*b* and second leads 4*b* may be shaped after singulation of semiconductor device package 1. For example, first leads 3*b* and second leads 4*b* may be formed into a gull-wing shape. However, it is noted that shaping or forming of first leads 3*b* and second leads 3*b* may also be performed prior to singulation, and that the shaping or forming is not limited to any particular shape of the leads.

As an example only, semiconductor die 2 as described above may be based one of a silicon, silicon carbide, gallium arsenide or gallium nitride technology.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including various modifications and/or combinations of features from different embodiments, without departing from the scope of the present disclosure as defined by the appended claims.

What is claimed is:

1. A semiconductor device package, comprising:

a semiconductor die having a circuit integrated thereon;

a first clip comprising a first planar portion and one or more first leads extending from the first planar portion, the first planar portion comprising one or more first protrusions;

a second clip comprising a second planar portion and one or more second leads extending from the second planar portion, the second planar portion comprising a plurality of second protrusions;

wherein the first planar portion and the second planar portion are each physically and electrically connected to a same terminal of the circuit arranged on the semiconductor die; and wherein at least one of the one or more first protrusions extends in a space between a pair of second protrusions among the plurality of second protrusions.

2. The semiconductor device package according to claim 1, wherein the one or more first protrusions are arranged symmetrically along an axis parallel to a direction in which the one or more first protrusions extend; and/or wherein the plurality of second protrusions are arranged symmetrically along an axis parallel to a direction in which the plurality of second protrusions extend.

3. The semiconductor device package according to claim 1, wherein the one or more first leads extend along an axis parallel to a direction in which the one or more first protrusions extend; and/or wherein the one or more second leads extend along an axis parallel to a direction in which the plurality of second protrusions extend; and/or wherein the one or more first protrusions extend in a direction opposite to a direction in which the plurality of second protrusions extend.

4. The semiconductor device package according to claim 1, wherein the first planar portion and the second planar portion each cover at least 20% of a surface of the semiconductor die on which they are arranged; and/or wherein the first planar portion and the second planar portion are spaced apart on the semiconductor die, wherein the semiconductor die has an uncovered portion of a surface not covered by the first and second planar portion that forms a meandering line, and wherein the uncovered portion extends from a first edge of the surface of the semiconductor die to a second edge of the surface, the second edge being opposite the first edge.

5. The semiconductor device package according to claim 1, further comprising a die pad on which the semiconductor die is arranged, wherein the die pad is electrically conductive, wherein the circuit comprises a further terminal electrically connected to the die pad, and wherein the die pad has a surface that is exposed to an outside of the semiconductor device package.

6. The semiconductor device package according to claim 1, wherein the circuit comprises a field-effect transistor (FET);

wherein the semiconductor device package further comprises a contact comprising a contact portion physically and electrically connected to a gate terminal of the FET, and one or more third leads extending from the contact portion; and a body of solidified molding compound encapsulating the semiconductor die, the first planar portion, the second planar portion and the contact portion, wherein the one or more first leads, the one or more second leads and the one or more third leads are at least partially arranged externally to the body of solidified molding compound; and/or wherein the one or more first leads, the one or more second leads and/or the one or more third leads are gull-wing shaped.

7. The semiconductor device package according to claim 2, wherein the one or more first leads extend along an axis parallel to a direction in which the one or more first protrusions extend; and/or wherein the one or more second leads extend along an axis parallel to a direction in which the plurality of second protrusions extend; and/or wherein the one or more first protrusions extend in a direction opposite to a direction in which the plurality of second protrusions extend.

8. The semiconductor device package according to claim 5, wherein the circuit comprises a field-effect transistor (FET), wherein:

the first clip is electrically connected to a drain terminal of the FET, and wherein the second clip is electrically connected to a source terminal of the FET; or wherein the die pad is electrically connected to a drain terminal of the FET, and wherein the first clip and the second clip (4) are electrically connected to a source terminal of the FET.

9. A method for manufacturing a semiconductor device package, the method comprising:

a) providing:

a semiconductor die having a circuit integrated thereon;

a first clip comprising a first planar portion and one or more first leads extending from the first planar portion, the first planar portion comprising one or more first protrusions; and a second clip comprising a second planar portion and one or more second leads extending from the second planar portion, the second planar portion comprising a plurality of second protrusions; and b) arranging the first planar portion and the second planar portion on the semiconductor die so that the first planar portion and the second planar portion are each physically and electrically connected to a same terminal of the circuit arranged on the semiconductor die and so that at least one of the one or more first protrusions extends in a space between a pair of second protrusions among the plurality of second protrusions.

10. The method according to claim 9, wherein the first clip is comprised in a first clip frame comprising a first clip frame portion and one or more of the first clips for manufacturing one or more respective semiconductor device packages, and wherein the method further comprises separating the first clip from the first clip frame portion, after arranging the first planar portion on the semiconductor die; and/or wherein the second clip is comprised in a second clip frame comprising a second clip frame portion and one or more of the second clips for manufacturing one or more respective semiconductor device packages, and wherein the method further comprises separating the second clip from the second clip frame portion, after arranging the second planar portion on the semiconductor die.

11. The method according to claim 9, wherein the first clip and the second clip are comprised in a same clip frame comprising a clip frame portion and one or more of the first and second clips for manufacturing one or more respective semiconductor device packages, and wherein the first planar portion and the second planar portion are substantially simultaneously arranged on the semiconductor die, and wherein the method further comprises separating the first clip and the second clip from the clip frame portion, after arranging the first planar portion and the second planar portion on the top surface of the semiconductor die.

12. The method according to claim 9, wherein the semiconductor die is arranged on a die pad, or wherein the method further comprises providing a die pad and arranging the semiconductor die on the die pad, wherein:

the die pad is electrically conductive;

the circuit comprises a further terminal electrically connected to the die pad; and a surface of the die pad is exposed to an outside of the semiconductor device package.

13. The method according to claim 9, wherein the semiconductor die is arranged on a die pad, or wherein the method further comprises providing a die pad and arranging the semiconductor die on the die pad, wherein:

the die pad is comprised in a pad frame comprising a pad frame portion and one or more of the die pads for manufacturing one or more respective semiconductor device packages; and the method further comprises separating the die pad from the pad frame portion.

14. The method according to claim 9, wherein the one or more first protrusions are arranged symmetrically along an axis parallel to a direction in which the one or more first protrusions extend; and/or wherein the plurality of second protrusions are arranged symmetrically along an axis parallel to a direction in which the plurality of second protrusions extend; and/or wherein the one or more first leads extend along an axis parallel to a direction in which the one or more first protrusions extend; and/or wherein the one or more second leads extend along an axis parallel to a direction in which the plurality of second protrusions extend; and/or wherein the one or more first protrusions extend in a direction opposite to a direction in which the plurality of second protrusions extend; and/or wherein the first planar portion and the second planar portion each cover at least 20% of a surface of the semiconductor die on which they are arranged.

15. The method according claim 9, wherein the first planar portion and the second planar portion are spaced apart on the semiconductor die, wherein the semiconductor die has an uncovered portion of a surface not covered by the first and second planar portion forms a meandering line, and wherein the uncovered portion extends from a first edge of the surface of the semiconductor die to a second edge of the surface, the second edge being opposite the first edge.

16. The method according to claim 9, wherein the circuit comprises a field-effect transistor (FET), wherein:

the first planar portion is electrically connected to a source terminal of the FET, and the second planar portion is electrically connected to a drain terminal of the FET; or the die pad is electrically connected to a drain terminal of the FET, and the first planar portion and the second planar portion are electrically connected to a source terminal of the FET.

17. The method according to claim 10, wherein the circuit comprises a field-effect transistor (FET), further comprising the steps of:

providing a contact comprising a contact portion and one or more third leads extending from the contact portion;

arranging the contact portion on the semiconductor die so that the contact portion is physically and electrically connected to a gate terminal of the FET;

applying a molding compound and allowing the molding compound to solidify to thereby form a body of solidified molding compound, the body of solidified molding compound encapsulating the semiconductor die, the first planar portion, the second planar portion and the contact portion;

wherein the one or more first leads, the one or more second leads and the one or more third leads are at least partially arranged externally to the body of solidified molding compound;

wherein the one or more first leads, the one or more second leads and/or, the one or more third leads are gull-wing shaped, or wherein the method further comprises forming the one or more first leads, the one or more second leads and/or, the one or more third leads into a gull-wing shape.

* * * * *